United States Patent
Huang et al.

(10) Patent No.: US 7,529,139 B2
(45) Date of Patent: May 5, 2009

(54) N-PORT MEMORY CIRCUITS ALLOWING M MEMORY ADDRESSES TO BE ACCESSED CONCURRENTLY AND SIGNAL PROCESSING METHODS THEREOF

(75) Inventors: Yu-Wen Huang, Taipei (TW); Chih-Wei Hsu, Taipei (TW); Chih-Hui Kuo, Hsinchu (TW)

(73) Assignee: MediaTek, Inc. (TW)

( * ) Notice: Subject to any disclaimer, the term of this patent is extended or adjusted under 35 U.S.C. 154(b) by 282 days.

(21) Appl. No.: 11/699,309

(22) Filed: Jan. 26, 2007

(65) Prior Publication Data

US 2008/0181040 A1    Jul. 31, 2008

(51) Int. Cl.
*G11C 7/00* (2006.01)

(52) U.S. Cl. .............. 365/189.02; 365/239; 365/230.02; 365/230.05; 365/185.03; 711/131; 711/119; 711/149

(58) Field of Classification Search ................. 365/219, 365/189.02, 230.02, 230.05, 185.03; 711/119, 711/131, 149
See application file for complete search history.

(56) References Cited

U.S. PATENT DOCUMENTS

| | | | | |
|---|---|---|---|---|
| 4,821,226 | A * | 4/1989 | Christopher et al. ... | 365/230.03 |
| 4,969,126 | A * | 11/1990 | Maeno ....................... | 365/240 |
| 6,331,958 | B2 * | 12/2001 | Tsukude ..................... | 365/201 |
| 6,480,947 | B1 * | 11/2002 | Hasegawa et al. ........... | 711/167 |
| 7,161,846 | B2 * | 1/2007 | Padaparambil ......... | 365/189.05 |
| 2007/0133311 | A1 * | 6/2007 | Kim et al. .............. | 365/189.02 |

* cited by examiner

*Primary Examiner*—Pho M. Luu
*Assistant Examiner*—Eric Wendler
(74) *Attorney, Agent, or Firm*—Andrew D. Fortney (57) ABSTRACT

Method and memory circuits capable of allowing M memory addresses of an N-port memory to be accessed concurrently, wherein N and M both are a natural number, and M is larger than N. Accordingly, a higher-order multi-port memory can be replaced by a lower-order multi-port or single-port memory. Consequently, smaller chip area or higher data access rate can be achieved.

26 Claims, 6 Drawing Sheets

N-PORT MEMORY CIRCUITS ALLOWING M MEMORY ADDRESSES TO BE ACCESSED CONCURRENTLY AND SIGNAL PROCESSING METHODS THEREOF

BACKGROUND OF THE INVENTION

1. Field of the Invention

The invention relates to N-port memory circuits capable of allowing M memory addresses to be accessed concurrently and methods for concurrently accessing M memory addresses of an N-port memory.

2. Description of the Prior Art

Two basic types of random access memory (RAM) circuits are common used in semiconductor industries. Static random access memory (SRAM) stores data by way of a feedback circuit. Dynamic random access memory (DRAM) stores data as electrostatic charge on a capacitor. Memory circuits may be single-port or multi-port. Single-port circuits are capable of allowing access to a single memory location (i.e. one cell or a group of cells at a single memory address). Multi-port circuits allow two or more memory locations to be accessed concurrently. Specifically, a "port" is a set of related address lines, data lines, and control signals that together are sufficient to perform one memory access at a particular point in time. Thus, a single-port memory, which only has one port, is capable of supporting only one access, that is one read operation or one write operation, in one clock cycle, while a dual-port memory, which has two ports, is capable of supporting two simultaneous accesses, that is two read operations, two write operations, or one read and one write operation in one clock cycle. A higher-order multi-port memory (e.g. three-port, four-port, etc.), which supports larger numbers of simultaneous accesses, is also available.

However, a major disadvantage of a typical multi-port SRAM circuit is the relatively large area it occupies compared to a fewer port SRAM circuit. For example, using a standard DRAM as a reference unit occupying one area unit, a single-port SRAM typically occupies four area units, and a dual-port SRAM typically occupies sixteen area units. That is to say, the size of a single-port SRAM is only a quarter of a dual-port SRAM with the same number of bits.

SUMMARY OF THE INVENTION

Methods and apparatuses for concurrently executing M read/write operations to an N-port memory circuit, where M is greater than N, for example, a single-port SRAM is capable of processing two or more read/write operations in one clock cycle of the original frequency.

Embodiments of the N-port memory circuits are capable of allowing a set of M memory addresses to be accessed concurrently, wherein N and M both are a natural number, M is larger than N, and the M memory addresses are provided to the N-port memory circuit at a first frequency. An N-port memory circuit comprises an up-sampling logic, an N-port memory, and a down-sampling logic.

The up-sampling logic, receiving inputs at the first frequency and generating outputs at a second frequency, is used for converting M memory addresses provided in parallel into N sets of memory addresses, where each set comprises M/N memory addresses, and the up-sampling logic outputs one set of memory addresses at each clock cycle. For example the up-sampling logic combines 2 memory addresses in parallel into one set of memory addresses in series. The N-port memory, operated at the second frequency, is used for sequentially receiving the N sets of memory addresses and processing N sets of data. The down-sampling logic is used for the read operations. In the case when all the operations are read operations, the down-sampling logic receives inputs at the second frequency and generating outputs at the first frequency, so it serially receives N sets of the data output from the N-port memory and outputs M data outputs in parallel. Furthermore, for write operations, an up-sampling logic is also used to convert M data inputs in parallel into N sets of data inputs, and an up-sampling logic converts M write enable signals into N sets of write enable signals, wherein the N sets of data inputs and N sets of write enable signals are respectively arranged in series, such that each port of the N-port memory can be enabled by one of the N sets of write enable signals to sequentially store one of the N sets of data inputs according to one of the N sets of memory addresses.

Accordingly, the N-port memory circuits are capable of allowing a number of memory addresses more than its port number to be accessed concurrently. Consequently, high data access rate can be achieved with a relatively small chip area.

The advantage and spirit of the invention may be understood by the following recitations together with the appended drawings.

DETAILED DESCRIPTION OF THE INVENTION

An N-port memory circuits capable of allowing a set of M memory addresses to be accessed concurrently is provided, wherein N and M both are a natural number and M is larger than N. In the following, some embodiments are proposed for depicting how to enable the spirit of the invention in detail.

Figure 1:
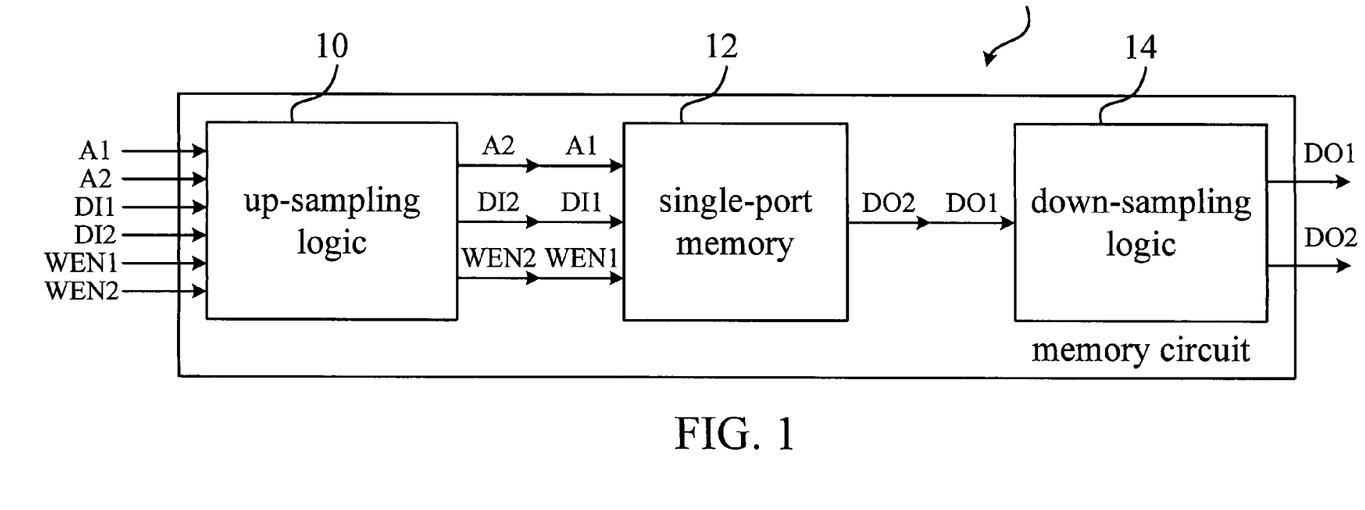
FIG. 1 is a functional block diagram illustrating an exemplary memory circuit.

FIG. 1 is a functional block diagram illustrating a memory circuit according to an embodiment of the invention. In this embodiment, the memory circuit 1 is capable of allowing two memory addresses A1 and A2 (M=2) to be accessed concurrently, wherein the memory addresses A1 and A2 is generated by an address generator (not shown) and inputted at a first frequency. The memory circuit 1 comprise an up-sampling logic 10, a single-port memory 12 (N=1), and a down-sampling logic 14.

In this embodiment, the up-sampling logic 10 receives inputs at the first frequency and generates outputs at a second frequency, the single-port memory 12 may be a static random access memory (SRAM) or the like and is operated at the second frequency, and the down-sampling logic 14 receives inputs at the second frequency and generates outputs at the first frequency. It should be noted that a phase of the first frequency is the same as that of the second frequency, and the second frequency is M/N times the first frequency. In this embodiment, since M is equal to 2 and N is equal to 1, the second frequency is 2 times the first frequency.

As shown in FIG. 1, for read operations, the up-sampling logic 10 merges two memory addresses A1 and A2 into one set of memory addresses in series. The single-port memory 12 sequentially receives the set of memory addresses A1 and A2 in series and outputs one set of data outputs DO1 and DO2 in series. The down-sampling logic 14 serially receives the data outputs DO1 and DO2 one by one, then outputs the two data outputs DO1 and DO2 in parallel.

For write operations, the up-sampling logic 10 converts two memory addresses A1 and A2 into one set of memory addresses in series, the up-sampling logic 10 also converts two data inputs DI1 and DI2 into one set of data inputs in series, and converts two write enable signals WEN1 for DI1 and WEN2 for DI2 into one write enable signal carrying the enabling information for both DI1 and DI2. The single-port memory 12 is enabled by the write enable signal to sequentially store each of the data inputs DI1 and DI2 according to of the corresponding memory addresses A1 and A2.

Figure 2:
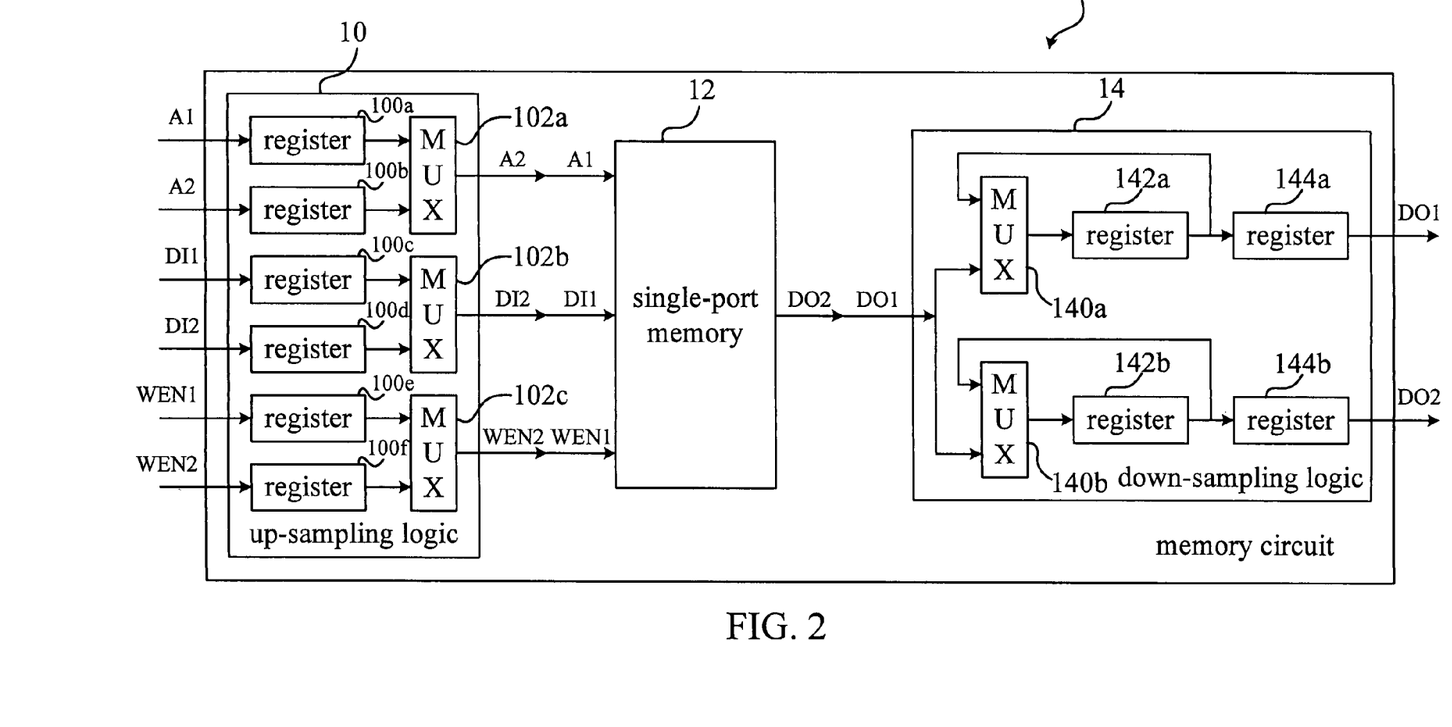
FIG. 2 is a functional block diagram illustrating the memory circuit shown in FIG. 1 in detail.

FIG. 2 is a functional block diagram illustrating the memory circuit 1 shown in FIG. 1 in detail. The up-sampling logic 10 comprises six registers 100*a*-100*f* and three multiplexers 102*a*-102*c*, wherein each of the multiplexers 102*a*-102*c* is respectively coupled between two of the registers 100*a*-100*f* and the single-port memory 12. The down-sampling logic 14 comprises two multiplexers 140*a* and 140*b* and four registers 142*a*, 142*b*, 144*a*, and 144*b*, wherein the multiplexers 140*a* and 140*b* are respectively coupled to the single-port memory 12, the registers 142*a* and 142*b* are respectively coupled to one of the multiplexers 140*a* and 140*b*, and the registers 144*a* and 144*b* are respectively coupled to one of the registers 142*a* and 142*b*.

Figure 3A:
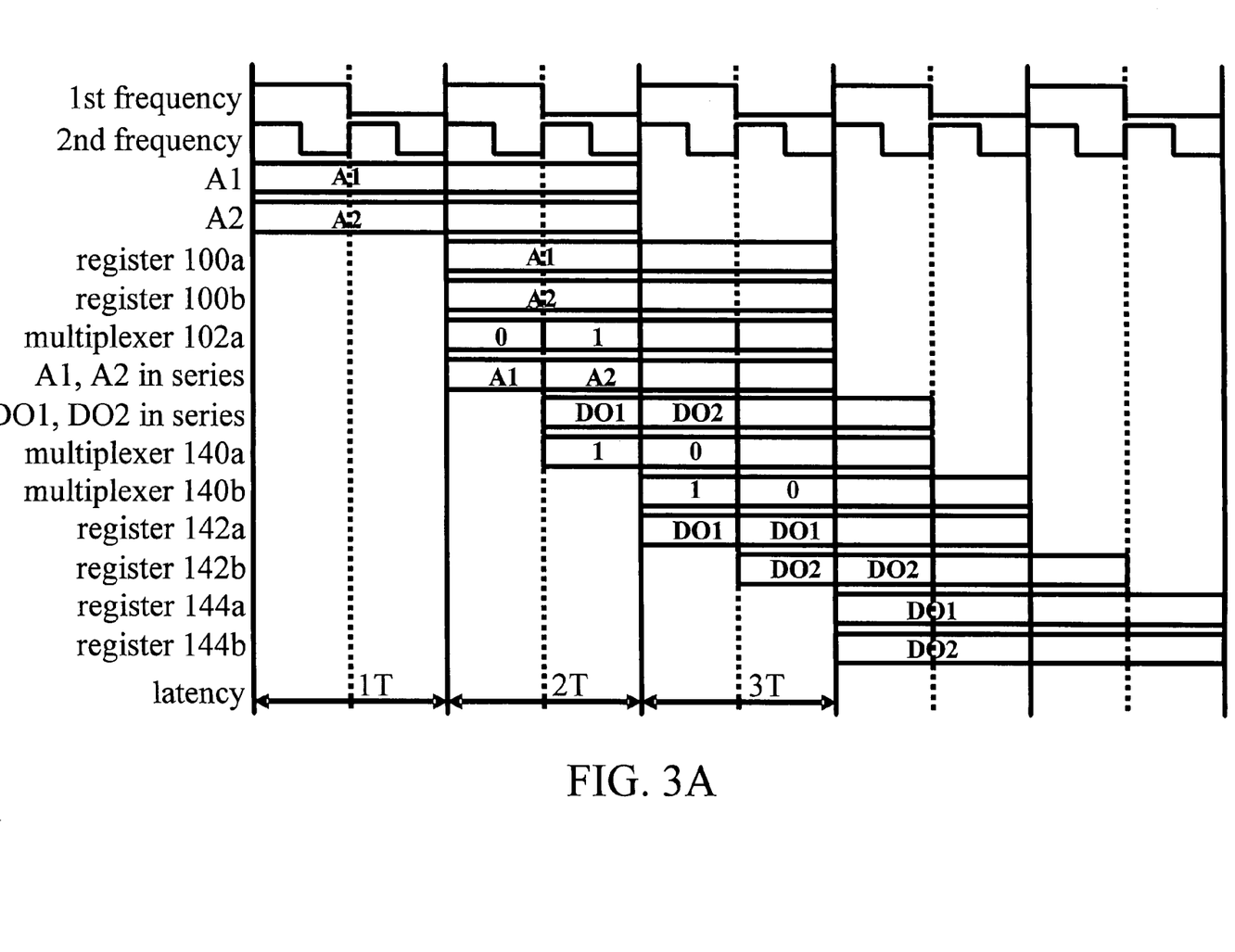
FIG. 3A is a timing diagram illustrating read operations of the memory circuits shown in FIG. 2.

Referring to FIG. 3A along with FIG. 2, FIG. 3A is a timing diagram illustrating read operations of the memory circuits 1 shown in FIG. 2. For read operations, each of the registers 100*a* and 100*b*, operated at the first frequency, latches one of the memory addresses A1 and A2. The multiplexer 102*a*, operated at the second frequency, resamples the memory addresses A1 and A2 latched in the registers 100*a* and 100*b* into a set of memory addresses by selectively outputting the memory addresses A1 and A2, thereby the multiplexer 102*a* generates the set of memory addresses running at the second frequency. After the single-port memory 12 receives the set of memory addresses in series and outputs the set of data outputs DO1 and DO2 in series, each of the multiplexers 140*a* and 140*b*, operated at the second frequency, is responsible for outputting one of the data outputs DO1 and DO2. The multiplexers 140*a* and 140*b* and the corresponding registers 142*a* and 142*b* latch the data output DO1 and DO2 for two clock cycles at the second frequency, which equals to one clock cycle at the first frequency. The registers 144*a* and 144*b* are optionally coupled to the register 142*a* and 142*b* to resample the data output DO1 or DO2 respectively, and these two registers can be operated at the first frequency. As shown in FIG. 3A, the memory circuit 1 needs three cycles of latency (3T) to output the data outputs DO1 and DO2 in parallel since the single-port memory receives the memory addresses A1 and A2.

Figure 3B:
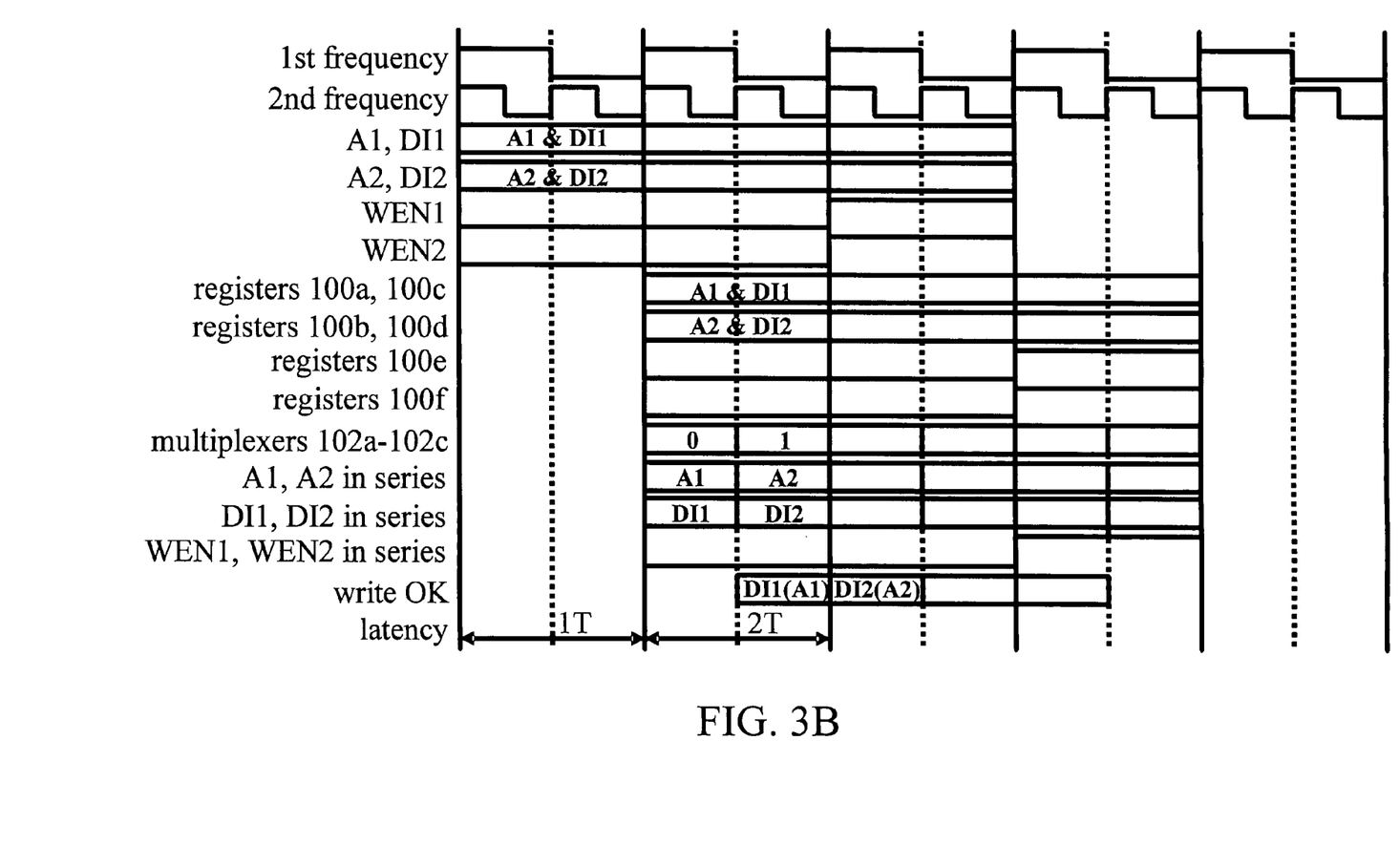
FIG. 3B is a timing diagram illustrating write operations of the memory circuits shown in FIG. 2.

Referring to FIG. 3B along with FIG. 2, FIG. 3B is a timing diagram illustrating write operations of the memory circuits 1 shown in FIG. 2. For write operations, each of the registers 100*a* and 100*b*, operated at the first frequency, latches one of the memory addresses A1 and A2, each of the registers 100*c* and 100*d*, operated at the first frequency, latches one of the data inputs DI1 and DI2, and each of the registers 100*e* and 100*f*, operated at the first frequency, latches one of the write enable signals WEN1 and WEN2. The multiplexer 102*a*, operated at the second frequency, resamples the memory addresses A1 and A2 latched in the registers 100*a* and 100*b* into a set of memory addresses by selectively outputting the memory addresses A1 and A2, thereby the multiplexer 102*a* generates the set of memory addresses running at the second frequency. The multiplexer 102*b*, operated at the second frequency, resamples the data inputs DI1 and DI2 latched in the registers 100*c* and 100*d* into a set of data inputs by selectively outputting the data inputs DI1 and DI2, thereby the multiplexer 102*b* generates the data inputs running at the second frequency. The multiplexer 102*c*, operated at the second frequency, resamples the write enable signals WEN1 and WEN2 latched in the registers 100*e* and 100*f* into a set of write enable signals by selectively outputting the write enable signals WEN1 and WEN2, thereby the multiplexer 102*c* generates the set of write enable signals running at the second frequency. Then, the single-port memory 12 is enabled by one of the write enable signals WEN1 and WEN2 to sequentially store one of the data inputs DI1 and DI2 according to one of the memory addresses A1 and A2. As shown in FIG. 3B, the memory circuit 1 needs two cycles of latency (2T) to store the data inputs DI1 and DI2 when receiving the memory addresses A1 and A2, the data inputs DI1 and DI2, and the write enable signals WEN1 and WEN2.

Figure 4:
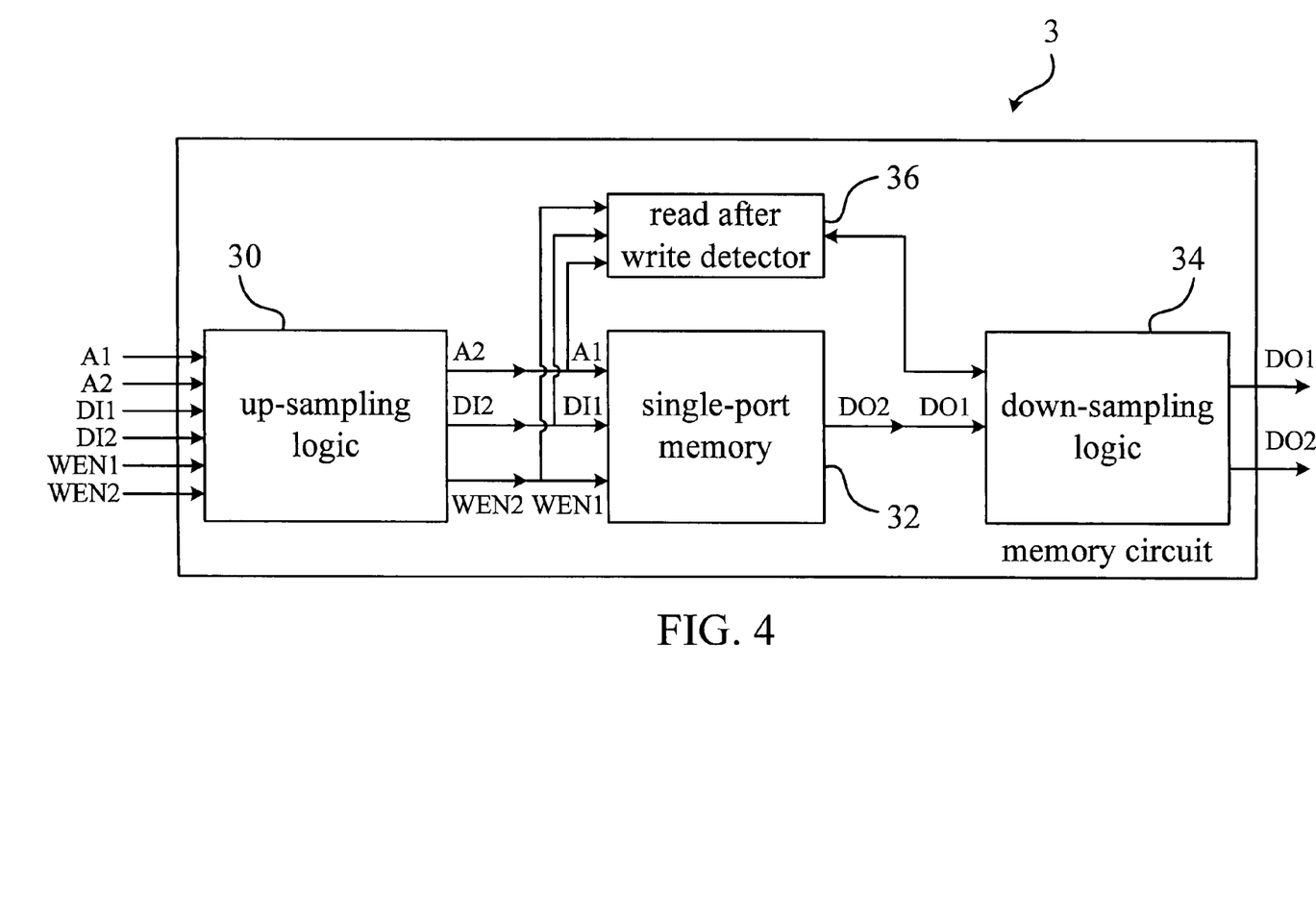
FIG. 4 is a functional block diagram illustrating a memory circuit according to another embodiment of the invention.

FIG. 4 is a functional block diagram illustrating a memory circuit 3 according to another embodiment of the invention. The main difference between the memory circuit 1 and the memory circuit 3 is that the memory circuit 3 further comprises read after write detector 36. The read after write detector 36 is respectively coupled to the up-sampling logic 30 and the down-sampling logic 34, as shown in FIG. 4. The read after write detector 36 generates a bypass control signal, such that the down-sampling logic 34 is capable of immediately selecting the data input processed previously from the up-sampling logic 30 in response to the bypass control signal. For example, when the memory circuit 1 shown in FIG. 1 is used for read-after-write operations, there will be five cycles of latency if data is repeatedly read from/written into the same memory address. However, for the memory circuit 3 shown in FIG. 4, since the down-sampling logic 34 is capable of immediately selecting the data input processed previously from the up-sampling logic 30 in response to the bypass control signal generated by the read after write detector 36, the bubble cycles of read-after-write operations will be eliminated.

In some embodiments, the memory circuits are applied to H.264/AVC encoding architectures to perform integer motion estimation (IME) and fractional motion estimation (FME) computations. The IME and FME computations are two neighboring pipelining stages, which share the same search area stored in a SRAM. A single port SRAM operating at twice the input frequency may replace a dual port SRAM for buffering the search area according to the present invention, which greatly reduces the chip area. In some other embodiments, the memory circuits are applied to a context based adaptive binary arithmetic coding (CABAC) engine in an H.264/AVC encoding architecture. A two-bin parallel CABAC engine encodes two bins per cycle for real-time processing HDTV videos, that is a total of 2 read and 2 write operations are required in every cycle. A two-port SRAM running at twice the input frequency can be used in such applications.

Figure 5A:
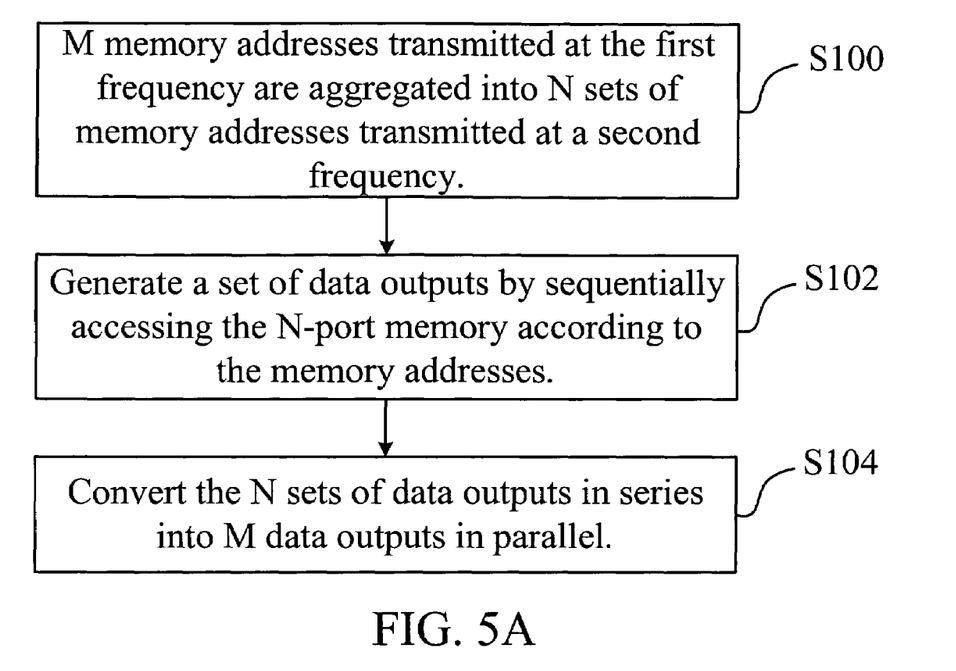
FIG. 5A is flowchart showing read operations of the memory circuits.

FIG. 5A is flowchart showing an exemplary signal processing method for reading data from an N-port memory. The signal processing method is capable of allowing M entries of data stored in an N-port memory to be concurrently accessed according to M memory addresses, wherein N and M both are a natural number, M is larger than N, and the set of M memory addresses is inputted at a first frequency. In step S100, M memory addresses transmitted at the first frequency are aggregated into N sets of memory addresses transmitted at a second frequency, wherein each set of the N sets of memory addresses is composed of M/N memory addresses arranged in series. For each set of the memory addresses, step S102 is performed to generate a set of data outputs by sequentially accessing the N-port memory according to the memory addresses, wherein the N-port memory is operated at the second frequency. Step S104 is performed to convert the N sets of data outputs in series into M data outputs in parallel.

Figure 5B:
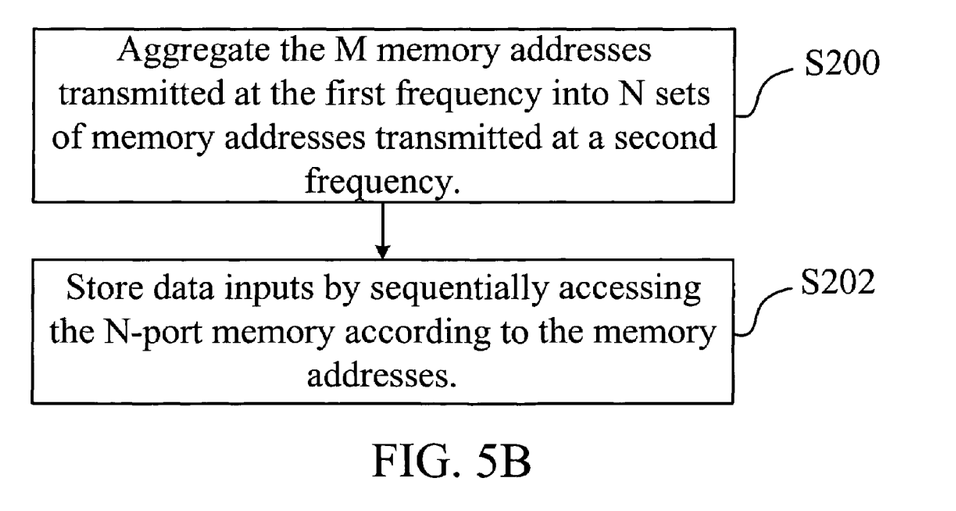
FIG. 5B is flowchart showing write operations of the memory circuits.

FIG. 5B is flowchart showing an exemplary signal processing method for writing data into an N-port memory. Step S200 is performed to aggregate M memory addresses transmitted at the first frequency into N sets of memory addresses transmitted at a second frequency, wherein the memory addresses in each of the N sets of memory addresses are arranged in series. Step S202 is performed to store data inputs by sequentially accessing the N-port memory according to the memory addresses, wherein the N-port memory is operated at the second frequency.

The memory circuits of the invention are designed to allow more memory accessing in one clock cycle compared to the original design, thus a higher-order multi-port memory can be replaced by a lower-order multi-port or single-port memory. Consequently, a smaller chip area or a higher data access rate can be achieved.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. An N-port memory circuit capable of allowing M memory addresses to be accessed concurrently, N and M both being natural numbers, M being larger than N, and the M memory addresses being inputted at a first frequency, the N-port memory circuits comprising:
   an up-sampling logic, receiving inputs at the first frequency and generating outputs at a second frequency, for converting the M memory addresses in parallel into N sets of memory addresses in series;
   an N-port memory, operated at the second frequency, for sequentially receiving the N sets of memory addresses, and outputting N sets of data outputs; and
   a down-sampling logic, receiving the data outputs from the N-port memory at the second frequency and generating outputs at the first frequency, for serially receiving the N sets of data outputs and outputting M data outputs in parallel.

2. The N-port memory circuit of claim 1, wherein the up-sampling logic comprises:
   M first registers, each first register is operated at the first frequency for latching one of the M memory addresses; and
   N first multiplexers, each first multiplexer is coupled between corresponding first registers and the N-port memory and operated at the second frequency for resampling the memory addresses latched in the corresponding first registers into a set of memory addresses by selectively outputting the memory addresses, thereby the N first multiplexers output N sets of memory addresses running at the second frequency.

3. The N-port memory circuit of claim 1, wherein the down-sampling logic comprises:
   M second multiplexers, each second multiplexer is coupled to the N-port memory and operated at the second frequency for selectively outputting one of the data outputs; and
   M second registers, each second register is coupled to one of the M second multiplexers and operated at the second frequency for buffering the data output transmitted from the corresponding second multiplexer.

4. The N-port memory circuit of claim 1, wherein the up-sampling logic converts M data inputs into N sets of data inputs and for converting M write enable signals into N sets of write enable signals, each of the N sets of data inputs or write enable signals are respectively arranged in series, such that each port of the N-port memory is enabled by one of the N sets of write enable signals to sequentially store one of the N sets of data inputs according to one of the N sets of memory addresses.

5. The N-port memory circuit of claim 1, wherein a phase of the first frequency is the same as that of the second frequency.

6. The N-port memory circuit of claim 1, wherein the N-port memory is a static random access memory (SRAM).

7. The N-port memory circuit of claim 1 is applied to an H.264/AVC encoding architecture to perform integer motion estimation (IME) and fractional motion estimation (FME) computation.

8. The N-port memory circuit of claim 1 is applied to a two-bin parallel context based adaptive binary arithmetic coding (CABAC) engine in an H.264/AVC encoding architecture.

9. The N-port memory circuit of claim 3, wherein the down-sampling logic further comprises M third registers each of which is coupled to one of the second registers and operated at the first frequency for resampling the data output received from the corresponding second register.

10. The N-port memory circuit of claim 4, wherein the up-sampling logic comprises:
    M registers, each register is operated at the first frequency for latching one of the M data inputs; and
    N multiplexers, each multiplexer coupled between corresponding registers and the N-port memory and operated at the second frequency, for resampling the data inputs latched in the registers into a set of data inputs by selectively outputting the data inputs, thereby N multiplexers generating N sets of data inputs running at the second frequency.

11. The N-port memory circuit of claim 4, wherein the up-sampling logic comprises:
    M registers, each register is operated at the first frequency for latching one of the M write enable signals; and
    N multiplexers, each multiplexer coupled between corresponding registers and the N-port memory and operated at the second frequency, for resampling the write enable signals latched in the registers into a set of write enable signals by selectively outputting the write enable signals, thereby N multiplexers generating N sets of write enable signals running at the second frequency.

12. The N-port memory circuit of claim 4, further comprising a read after write detector, coupled to the up-sampling logic and the down-sampling logic, for generating a bypass control signal, such that the down-sampling logic is capable of immediately selecting the data input processed previously from the up-sampling logic in response to the bypass control signal.

13. A method of concurrently accessing M memory addresses of an N-port memory, N and M both being natural numbers, M being larger than N, and the set of M memory addresses being inputted at a first frequency, the method comprising the steps of:
   (a) aggregating the M memory addresses transmitted at the first frequency into N sets of memory addresses transmitted at a second frequency, wherein the memory addresses in each set of memory addresses are arranged in series, and the second frequency is higher than the first frequency;
   (b) for each set of memory addresses, generating a set of data outputs or storing a set of data inputs by sequentially accessing the N-port memory according to the set of memory addresses, for read operations or write operations respectively, wherein the N-port memory is operated at the second frequency; and
   (c) for read operations, serially receiving the N sets of data outputs transmitted at the second frequency and converting to M data outputs in parallel transmitted at the first frequency.

14. The method of claim 13, for write operations, further comprising the step of aggregating M data inputs transmitted at the first frequency into N sets of data inputs transmitted at the second frequency, wherein the data inputs in each of the N sets of data inputs are arranged in series.

15. The method of claim 13, wherein the step (a) comprises the steps of:
   (a1) latching each of the M memory addresses based on the first frequency; and
   (a2) alternatively outputting the M memory addresses to form the N sets of memory addresses, wherein each of the N sets of memory addresses comprises M/N memory addresses.

16. The method of claim 13, wherein the step (c) comprises the steps of:
   (c1) segregating each of the N sets of data outputs transmitted at the second frequency into M data outputs transmitted in parallel at the first frequency; and
   (c2) buffering each of the data outputs.

17. The method of claim 13, further comprising the step of:
   aggregating M write enable signals transmitted at the first frequency into N sets of write enable signals transmitted in series at the second frequency, such that each port of the N-port memory is enabled by one of the N sets of write enable signals to sequentially store one of the N sets of data inputs according to one of the N sets of memory addresses.

18. The method of claim 13, further comprising the step of: latching each of the M data inputs based on the first frequency.

19. The method of claim 13, further comprising the step of generating a bypass control signal, such that the data input processed previously is selected immediately in response to the bypass control signal instead of being read from the N-port memory.

20. The method of claim 13, wherein a phase of the first frequency is the same as that of the second frequency.

21. The method of claim 17, wherein the step (a) comprises the steps of:
latching each of the M write enable signals based on the first frequency.

22. An N-port memory circuit capable of allowing M memory addresses to be accessed concurrently, N and M both being natural numbers, M being larger than N, and the M memory addresses being inputted at a first frequency, the N-port memory circuits comprising:
   an up-sampling logic, receiving inputs at the first frequency and generating outputs at a second frequency, for converting the M memory addresses into N sets of memory addresses, for converting M data inputs into N sets of data inputs, and for converting M write enable signals into N sets of write enable signals, each set of the memory addresses, data inputs, and write enable signals is respectively arranged in series; and
   an N-port memory, operated at the second frequency, each port of the N-port memory being enabled by one of the N sets of write enable signals to sequentially store one of the N sets of data inputs according to one of the N sets of memory addresses.

23. The N-port memory circuit of claim 22, wherein the up-sampling logic comprises:
   M first registers, each first register is operated at the first frequency for latching one of the M memory addresses; and
   N multiplexers, each multiplexer is coupled between corresponding first registers and the N-port memory and operated at the second frequency for resampling the memory addresses latched in the first registers into a set of memory addresses by selectively outputting the memory addresses, thereby the N multiplexers generate N sets of memory addresses running at the second frequency.

24. The N-port memory circuit of claim 22, wherein the up-sampling logic comprises:
   M second registers, each second register is operated at the first frequency for latching one of the M data inputs; and
   N second multiplexers, each second multiplexer coupled between corresponding second registers and the N-port memory and operated at the second frequency, for resampling the data inputs latched in the second registers into a set of data inputs by selectively outputting the data inputs, thereby N multiplexers generating N sets of data inputs running at the second frequency.

25. The N-port memory circuit of claim 22, wherein the up-sampling logic comprises:
   M third registers each third register is operated at the first frequency for latching one of the M write enable signals; and
   N third multiplexers, each third multiplexer coupled between corresponding third registers and the N-port memory and operated at the second frequency, for resampling the write enable signals latched in the third registers into a set of write enable signals by selectively outputting the write enable signals, thereby N multiplexers generating N sets of write enable signals running at the second frequency.

26. The N-port memory circuit of claim 23, wherein a phase of the first frequency is the same as that of the second frequency.

* * * * *